United States Patent
Yamada

(10) Patent No.: US 12,342,731 B2
(45) Date of Patent: Jun. 24, 2025

(54) MAGNETIC DOMAIN WALL MOVEMENT ELEMENT INCLUDING RESISTIVITY VARYING FERROMAGNETIC LAYERS

(71) Applicant: TDK CORPORATION, Tokyo (JP)

(72) Inventor: Shogo Yamada, Tokyo (JP)

(73) Assignee: TDK CORPORATION, Tokyo (JP)

(*) Notice: Subject to any disclaimer, the term of this patent is extended or adjusted under 35 U.S.C. 154(b) by 656 days.

(21) Appl. No.: 17/772,325

(22) PCT Filed: Feb. 20, 2020

(86) PCT No.: PCT/JP2020/006672
§ 371 (c)(1),
(2) Date: Apr. 27, 2022

(87) PCT Pub. No.: WO2021/166137
PCT Pub. Date: Aug. 26, 2021

(65) Prior Publication Data
US 2022/0376168 A1    Nov. 24, 2022

(51) Int. Cl.
*H10N 50/80* (2023.01)
*H10B 61/00* (2023.01)
*H10N 50/85* (2023.01)

(52) U.S. Cl.
CPC ........... *H10N 50/80* (2023.02); *H10B 61/00* (2023.02); *H10N 50/85* (2023.02)

(58) Field of Classification Search
CPC ........ H10N 50/82; H10N 50/85; H10B 61/00; H10B 61/22; H01L 43/02; H01L 43/08
See application file for complete search history.

(56) References Cited

U.S. PATENT DOCUMENTS

| | | | |
|---|---|---|---|
| 2001/0003023 A1* | 6/2001 | Saito | B82Y 25/00 |
| 2001/0040780 A1* | 11/2001 | Pinarbasi | G11B 5/3903 |
| 2002/0171100 A1* | 11/2002 | Pohm | B82Y 25/00 |
| | | | 257/E27.005 |

(Continued)

FOREIGN PATENT DOCUMENTS

| | | |
|---|---|---|
| JP | 2008-211008 A | 9/2008 |
| JP | 5206414 B2 | 6/2013 |

(Continued)

OTHER PUBLICATIONS

May 12, 2020 International Search Report issued in International Patent Application No. PCT/JP2020/006672.

*Primary Examiner* — Ida M Soward
(74) *Attorney, Agent, or Firm* — Oliff PLC

(57) ABSTRACT

A magnetic domain wall movement element includes a magnetic recording layer which includes a ferromagnetic material; a non-magnetic layer which is laminated on the magnetic recording layer; and a magnetization reference layer which is laminated on the non-magnetic layer, in which the magnetic recording layer has a first ferromagnetic layer, a spacer layer, and a second ferromagnetic layer in order from the non-magnetic layer, a magnetization of the first ferromagnetic layer and a magnetization of the second ferromagnetic layer are antiferromagnetically coupled, and an electrical resistivity of the first ferromagnetic layer is higher than the electrical resistivity of the second ferromagnetic layer.

13 Claims, 9 Drawing Sheets

(56) References Cited

U.S. PATENT DOCUMENTS

| | | | |
|---|---|---|---|
| 2008/0204946 A1* | 8/2008 | Ochiai | G11C 19/0808 360/324.12 |
| 2009/0296454 A1* | 12/2009 | Honda | G11C 11/1655 365/158 |
| 2010/0142264 A1* | 6/2010 | Numata | G11C 19/0808 365/171 |
| 2019/0333558 A1 | 10/2019 | Shibata | |
| 2019/0363244 A1* | 11/2019 | Sasaki | G11C 11/1675 |
| 2020/0083288 A1* | 3/2020 | Kanaya | G11C 11/1655 |
| 2020/0194664 A1 | 6/2020 | Shinohara et al. | |

FOREIGN PATENT DOCUMENTS

| | | |
|---|---|---|
| WO | 2007/020823 A1 | 2/2007 |
| WO | 2019/082323 A1 | 5/2019 |
| WO | 2019/138535 A1 | 7/2019 |

\* cited by examiner

MAGNETIC DOMAIN WALL MOVEMENT ELEMENT INCLUDING RESISTIVITY VARYING FERROMAGNETIC LAYERS

TECHNICAL FIELD

The present disclosure relates to a magnetic domain wall movement element and a magnetic recording array.

BACKGROUND ART

Next-generation non-volatile memories that will replace flash memories and the like that are reaching their limit in miniaturization are receiving attention. For example, a magnetoresistive random access memory (MRAM), a resistance random access memory (ReRAM), a phase-change random access memory (PCRAM), and the like are known as next-generation non-volatile memories.

An MRAM uses a resistance value change caused by a change in direction of magnetization in data recording. The data recording is carried out by each of variable magnetoresistive elements constituting the MRAM. For example, Patent Document 1 describes a variable magnetoresistive element (a magnetic domain wall movement element) capable of recording multi-valued data by moving the magnetic domain wall inside the magnetic recording layer.

CITATION LIST

Patent Literature

[Patent Document 1]
Japanese Patent No. 5206414

SUMMARY OF INVENTION

Technical Problem

The magnetic domain wall movement element differs in a resistance value depending on a position of the magnetic domain wall, and records the change in resistance value as data. The magnetic domain wall moves when a writing current is applied into the magnetic recording layer. When a current density of the writing current is high, the magnetic domain wall moves greatly. On the other hand, if the current density of the writing current is high, a large amount of Joule heat is generated and the reliability of the data is lowered.

The present disclosure is made in view of the above problems, and an object of the present disclosure is to provide a magnetic domain wall movement element and a magnetic recording array in which movement efficiency of the magnetic domain wall is high.

Solution to Problem (1) The magnetic domain wall movement element of a first aspect includes a magnetic recording layer which includes a ferromagnetic material; a non-magnetic layer which is laminated on the magnetic recording layer; and a magnetization reference layer which is laminated on the non-magnetic layer, in which the magnetic recording layer has a first ferromagnetic layer, a spacer layer, and a second ferromagnetic layer in order from the non-magnetic layer, a magnetization of the first ferromagnetic layer and a magnetization of the second ferromagnetic layer are antiferromagnetically coupled, and an electrical resistivity of the first ferromagnetic layer is higher than an electrical resistivity of the second ferromagnetic layer.

(2) In the magnetic domain wall movement element according to the above aspect, a value obtained by dividing the electrical resistivity by an area of a cross section orthogonal to a first direction in which the magnetic recording layer extends may be greater in the first ferromagnetic layer than in the second ferromagnetic layer.

(3) In the magnetic domain wall movement element according to the above aspect, the first ferromagnetic layer may have a greater electrical resistance than the second ferromagnetic layer.

(4) In the magnetic domain wall movement element according to the above aspect, the first ferromagnetic layer and the second ferromagnetic layer may have different constituent elements or compositions.

(5) In the magnetic domain wall movement element according to the above aspect, at least one of the first ferromagnetic layer and the second ferromagnetic layer may have a plurality of ferromagnetic layers.

(6) In the magnetic domain wall movement element according to the above aspect, the first ferromagnetic layer may have a plurality of ferromagnetic layers, and the electrical resistivity of a first layer closest to the non-magnetic layer among the plurality of ferromagnetic layers may be higher than the electrical resistivity of other layers of the plurality of ferromagnetic layers.

(7) In the magnetic domain wall movement element according to the above aspect, in a value obtained by dividing the electrical resistivity by the area of the cross section orthogonal to the first direction in which the magnetic recording layer extends may be greater in the first layer than in the other layers.

(8) In the magnetic domain wall movement element according to the above aspect, the first layer may have a greater electrical resistance than the other layers.

(9) In the magnetic domain wall movement element according to the above aspect, the ferromagnetic layer which is in contact with the non-magnetic layer may include CoFeB.

(10) In the magnetic domain wall movement element according to the above aspect, on a first surface of the first ferromagnetic layer which is in contact with the non-magnetic layer, a width in a second direction intersecting the first direction in which the magnetic recording layer extends in a plan view from a laminating direction may be narrower than a width of a second surface opposite to the first surface.

(11) In the magnetic domain wall movement element according to the above aspect, a saturated magnetization of the first ferromagnetic layer may be different from a saturated magnetization of the second ferromagnetic layer.

(12) In the magnetic domain wall movement element according to the above aspect, the spacer layer may have a lower thermal conductivity than the second ferromagnetic layer.

(13) A magnetic recording array of a second aspect has a plurality of magnetic domain wall movement elements according to the above aspect.

Advantageous Effects of Invention

The magnetic domain wall movement element and the magnetic recording array according to the above aspect have high movement efficiency of the magnetic domain wall.

DESCRIPTION OF EMBODIMENTS

Figure 1:
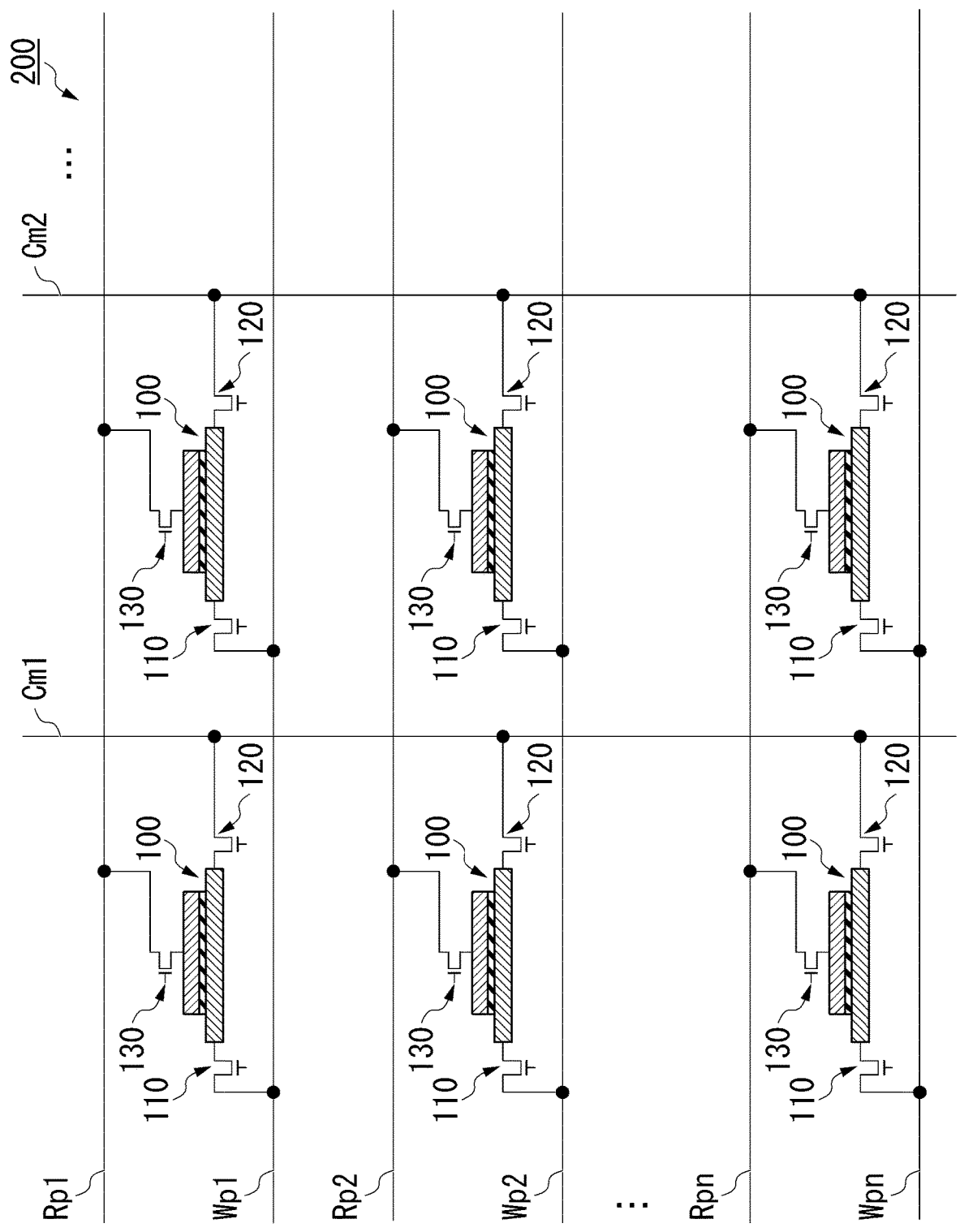
FIG. 1 is a configuration diagram of a magnetic recording array according to a first embodiment.

Hereinafter, the present embodiment will be described in detail while referring to the drawings as appropriate. The drawings used in the following description may be enlarged for convenience to make the features of the present disclosure easy to understand, and dimensional ratios and the like of the respective constituent elements may differ from the actual ones. The materials, dimensions, and the in the following description are exemplary examples, and the present disclosure is not limited thereto, and can be appropriately modified and carried out within the range in which the effects of the present disclosure are exhibited.

First, the directions will be defined. An x direction and a y direction are directions substantially parallel to one surface of a substrate Sub (see FIG. 2) to be described below. The x direction is a direction in which a magnetic recording layer 10 to be described below extends, and is a direction from a first conductive layer 40 to be described below to a second conductive layer 50. The x direction is an example of a first direction. The y direction is a direction orthogonal to the x direction. The y direction is an example of a second direction. A z direction is a direction from the substrate Sub to be described below toward the magnetic domain wall movement element 100. The z direction coincides with, for example, a laminating direction of the magnetic recording layer 10. Further, in the present specification, the expression "extending in the x direction" means that, for example, a dimension in the x direction is larger than the smallest dimension among the dimensions in the x direction, the y direction, and the z direction. The same also applies to the case of extending in other directions.

First Embodiment

FIG. 1 is a configuration diagram of a magnetic recording array according to the first embodiment. The magnetic recording array 200 is equipped with a plurality of magnetic domain wall movement elements 100, a plurality of first wirings Wp1 to Wpn, a plurality of second wirings Cm1 to Cmn, a plurality of third wirings Rp1 to Rpn, a plurality of first switching elements 110, a plurality of second switching elements 120, and a plurality of third switching elements 130. The magnetic recording array 200 can be used, for example, in a magnetic memory, a multiply and accumulate calculation device, and a neuromorphic device.

<First Wirings, Second Wirings, and Third Wirings>

The first wirings Wp1 to Wpn are write wirings. The first wirings Wp1 to Wpn electrically connect a power supply and one or more magnetic domain wall movement elements 100. The power supply is connected to one end portion of the magnetic recording array 200 during use.

The second wirings Cm1 to Cmn are common wirings. The common wirings are wirings that can be used both when writing data and when reading data. The second wirings Cm1 to Cmn electrically connect a reference potential and one or more magnetic domain wall movement elements 100. The reference potential is, for example, the ground. The second wirings Cm1 to Cmn may be provided in each of the plurality of magnetic domain wall movement elements 100, or may be provided over the plurality of magnetic domain wall movement elements 100.

The third wirings Rp1 to Rpn are read wirings. The third wirings Rp1 to Rpn electrically connect the power supply and one or more magnetic domain wall movement elements 100. The power supply is connected to one end portion of the magnetic recording array 200 during use.

<First Switching Element, Second Switching Element, and Third Switching Element>

The first switching element 110, the second switching element 120, and the third switching element 130 shown in FIG. 1 are connected to each of the plurality of magnetic domain wall movement elements 100. The first switching element 110 is connected between each of the magnetic domain wall movement elements 100 and each of the first wirings Wp1 to Wpn. The second switching element 120 is connected between each of the magnetic domain wall movement elements 100 and each of the second wirings Cm1 to Cmn. The third switching element 130 is connected between each of the magnetic domain wall movement elements 100 and each of the third wirings Rp1 to Rpn.

When the first switching element 110 and the second switching element 120 are turned on, a writing current flows between the first wirings Wp1 to Wpn and the second wirings Cm1 to Cmn connected to the predetermined magnetic domain wall movement element 100. When the second switching element 120 and the third switching element 130 are turned on, a reading current flows between the second wirings Cm1 to Cmn and the third wirings Rp1 to Rpn connected to the predetermined magnetic domain wall movement element 100.

The first switching element 110, the second switching element 120, and the third switching element 130 are elements that control the flow of an electric current. The first switching element 110, the second switching element 120, and the third switching element 130 are, for example, a transistor, an element such as an ovonic threshold switch (OTS) that utilizes a phase change of a crystal layer, an element such as a metal insulator transition (MIT) switch that utilizes a change in band structure, an element such as a Zener diode or an avalanche diode that utilizes a breakdown voltage, or an element whose conductivity changes with a change in atomic position.

Any one of the first switching element 110, the second switching element 120, and the third switching element 130 may be shared by the magnetic domain wall movement element 100 connected to the same wiring. For example, when the first switching element 110 is shared, one first switching element 110 is provided upstream of the first wirings Wp1 to Wpn. For example, when the second switching element 120 is shared, one second switching element 120 is provided upstream of the second wirings Cm1 to Cmn. For example, when the third switching element 130 is shared, one third switching element 130 is provided upstream of the third wirings Rp1 to Rpn.

Figure 2:
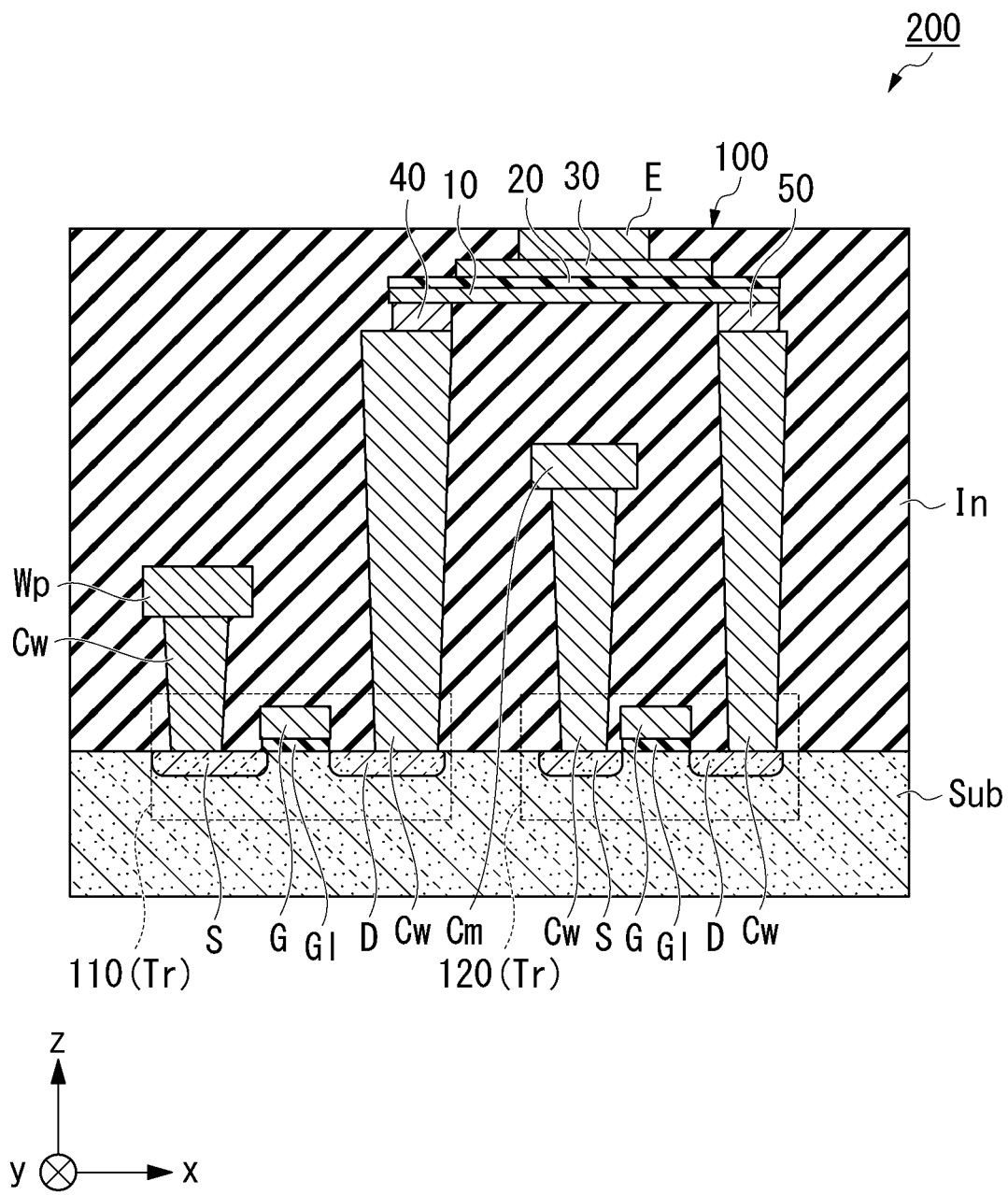
FIG. 2 is a cross-sectional view of a characteristic portion of the magnetic recording array according to the first embodiment.

FIG. 2 is a cross-sectional view of a main part of the magnetic recording array 200 according to the first embodiment. FIG. 2 is a cross section in which one magnetic domain wall movement element 100 in FIG. 1 is cut along an x-z plane passing through the center of the width of the magnetic recording layer 10 in the y direction.

The first switching element 110 and the second switching element 120 shown in FIG. 2 are transistors Tr. Each of the transistors Tr has a gate electrode G, a gate insulating film GI, and a source region S and a drain region D formed on the substrate Sub. The substrate Sub is, for example, a semiconductor substrate. The third switching element 130 is electrically connected to the electrode E and is located, for example, in the y direction.

Each of the transistors Tr and the magnetic domain wall movement element 100 are electrically connected via a connection wiring Cw. The connection wiring Cw includes a material having conductivity. The connection wiring Cw extends, for example, in the z direction. The connection wiring Cw is, for example, a via wiring formed in an opening portion of the insulating layer In.

The magnetic domain wall movement element 100 and the transistors Tr are electrically separated by an insulating layer In, except for the connection wiring Cw. The insulating layer In is an insulating layer that insulates between the wirings of the multilayer wiring and between the elements. The insulating layer In includes, for example, silicon oxide ($SiO_x$), silicon nitride ($SiN_x$), silicon carbide (SiC), chromium nitride, silicon carbide (SiCN), silicon oxynitride (SiON), aluminum oxide ($Al_2O_3$), zirconium oxide ($ZrO_x$), or the like.

"Magnetic Domain Wall Movement Element"

Figure 3:
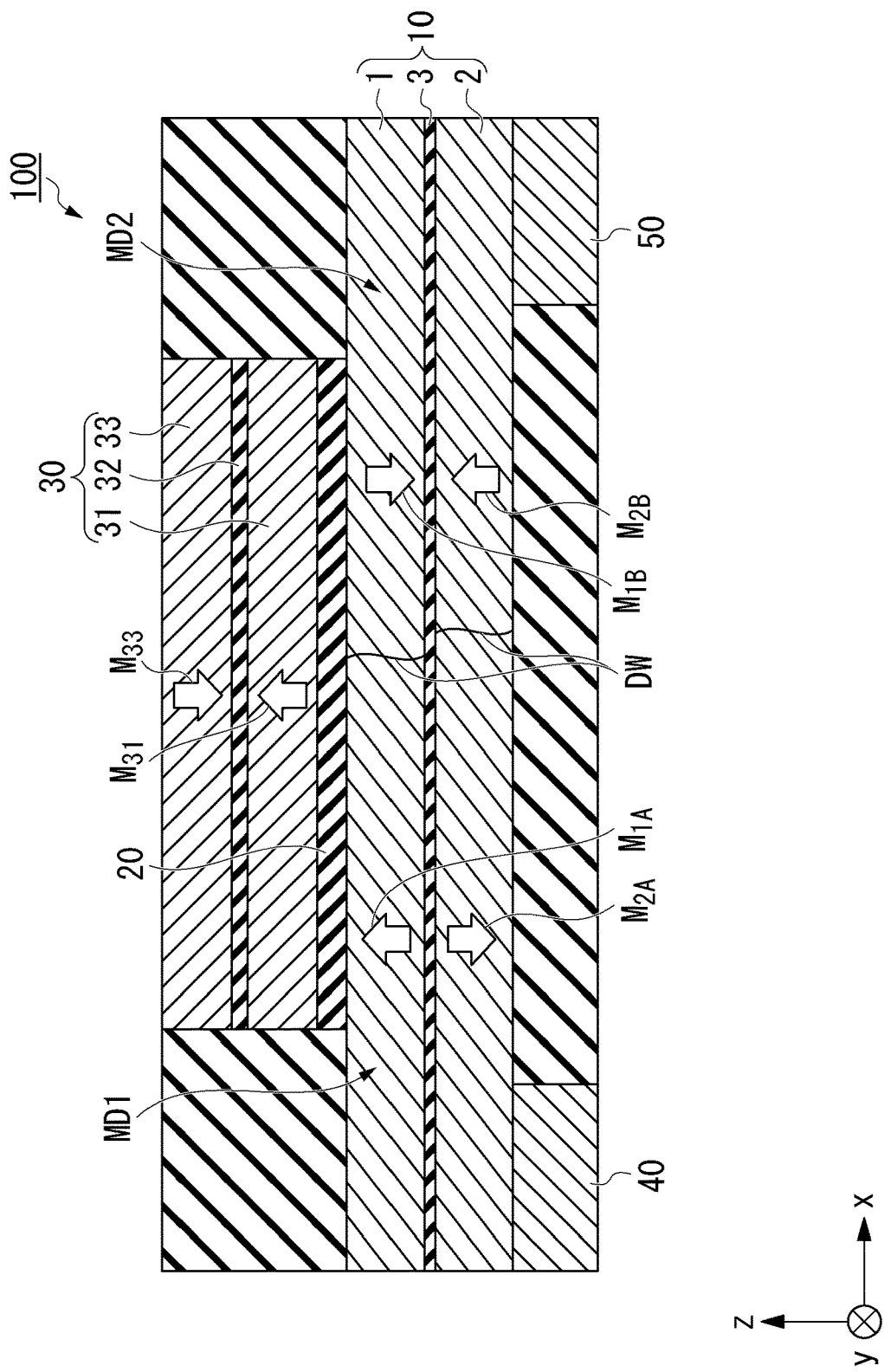
FIG. 3 is a cross-sectional view of a magnetic domain wall movement element according to the first embodiment.
Figure 4:
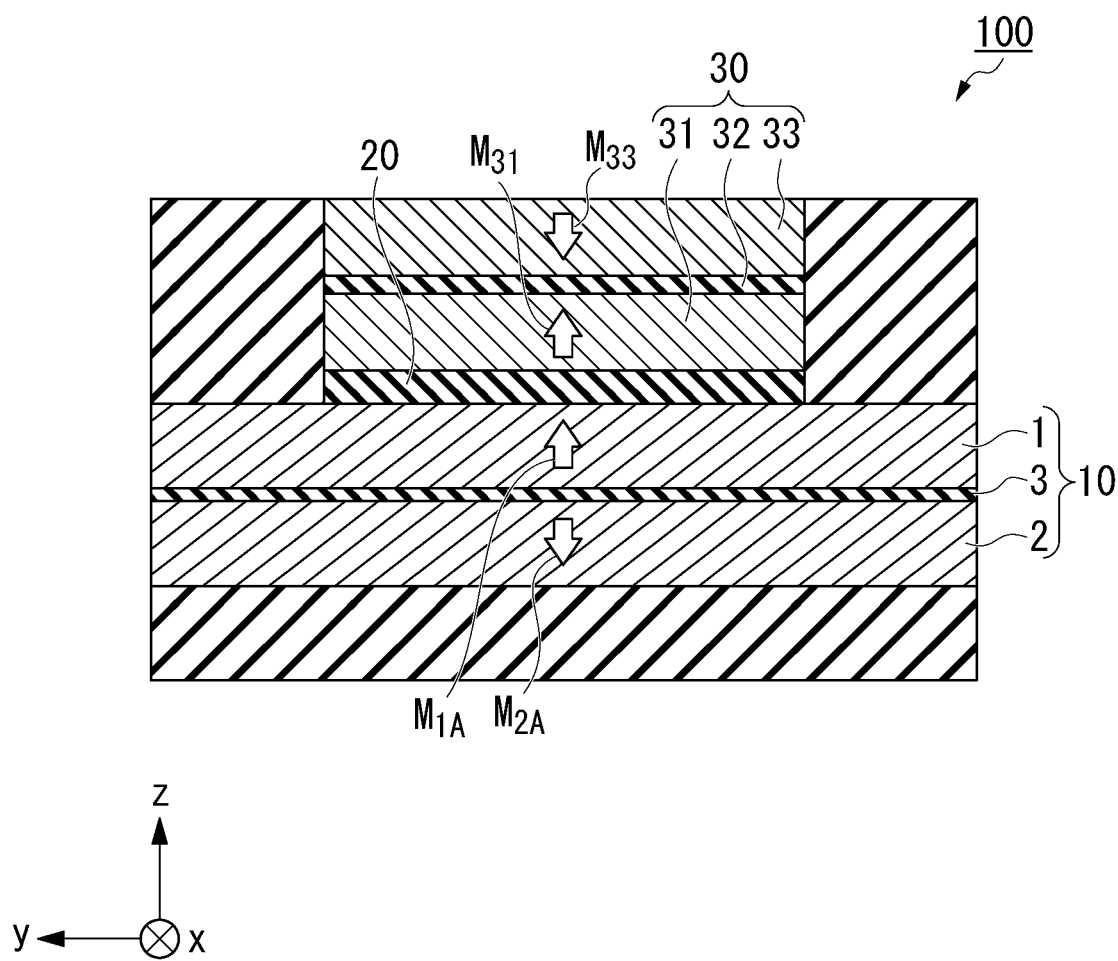
FIG. 4 is a cross-sectional view of a magnetic domain wall movement element according to the first embodiment.
Figure 5:
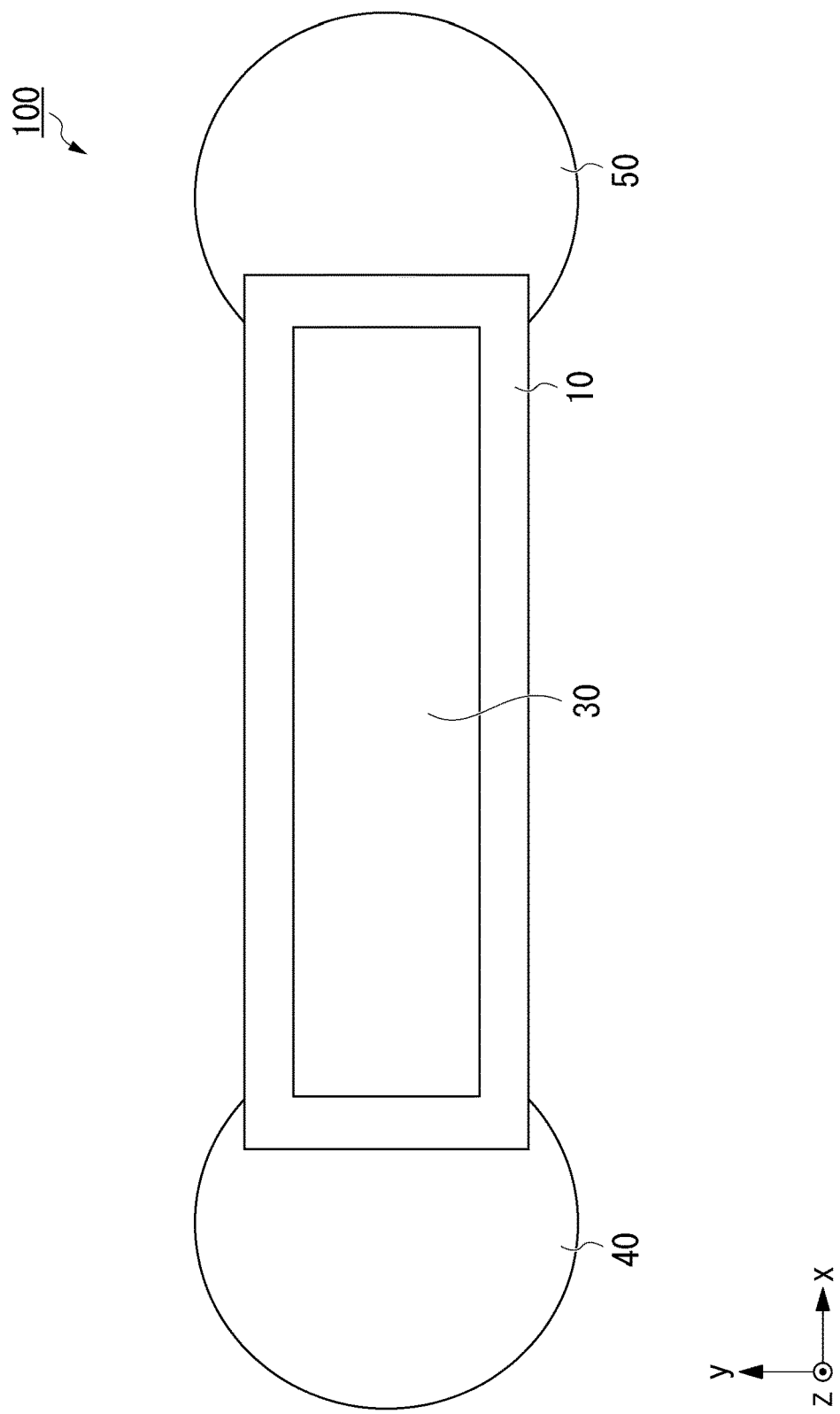
FIG. 5 is a plan view of the magnetic domain wall movement element according to the first embodiment.

FIG. 3 is a cross-sectional view in which the magnetic domain wall movement element 100 is cut along an x-z plane passing through the center of the magnetic recording layer 10 in the y direction. FIG. 4 is a cross-sectional view in which the magnetic domain wall movement element 100 is cut along a y-z plane passing through the center of the magnetic recording layer 10 in the x direction. FIG. 5 is a plan view in which the magnetic domain wall movement element 100 is viewed in a plan view from the z direction.

The magnetic domain wall movement element 100 has a magnetic recording layer 10, a non-magnetic layer 20, a magnetization reference layer 30, a first conductive layer 40, and a second conductive layer 50. The magnetic domain wall movement element 100 is covered with the insulating layer In. When data is written to the magnetic domain wall movement element 100, a writing current is made to flow through the magnetic recording layer 10 between the first conductive layer 40 and the second conductive layer 50. When data is read from the magnetic domain wall movement element 100, a reading current is made to flow between the first conductive layer 40 or the second conductive layer 50 and the magnetization reference layer 30.

"Magnetic Recording Layer"

The magnetic recording layer 10 extends in the x direction. A writing current flows through the magnetic recording layer 10 when data is written. The magnetic recording layer 10 is a layer capable of magnetically recording information by a change in the internal magnetic state. The magnetic recording layer 10 may be called a ferromagnetic layer or a magnetic domain wall moving layer.

The magnetic recording layer 10 has a magnetic domain wall DW inside. The magnetic domain wall DW is a boundary between a first magnetic domain MD1 and a second magnetic domain MD2. The first magnetic domain MD1 is, for example, a region on a side closer to the first conductive layer 40 than the magnetic domain wall DW in the magnetic recording layer 10. The second magnetic domain MD2 is, for example, a region on a side closer to the second conductive layer 50 than the magnetic domain wall DW in the magnetic recording layer 10. The magnetizations $M_{1A}$ and $M_{2A}$ of the first magnetic domain MD1 and the magnetizations $M_{1B}$ and $M_{2B}$ of the second magnetic domain MD2 are oriented in different directions. The magnetizations $M_{1A}$ and $M_{2A}$ of the first magnetic domain MD1 and the magnetizations $M_{1B}$ and $M_{2B}$ of the second magnetic domain MD2 are oriented, for example, in opposite directions.

When the magnetic domain wall DW moves, a ratio of the first magnetic domain MD1 and the second magnetic domain MD2 in the magnetic recording layer 10 changes. The magnetic domain wall DW moves by making a writing current flow in the x direction of the magnetic recording layer 10. For example, when a writing current (for example, a current pulse) in the +x direction is applied to the magnetic recording layer 10, electrons flow in the −x direction opposite to the current, and the magnetic domain wall DW moves in the −x direction. When the current flows from the first magnetic domain MD1 to the second magnetic domain MD2, the electrons spin-polarized in the second magnetic domain MD2 reverse the magnetizations $M_{1A}$ and $M_{2A}$ of the first magnetic domain MD1. The magnetic domain wall DW moves in the −x direction by the magnetization reversal of the magnetizations $M_{1A}$ and $M_{2A}$ in the first magnetic domain MD1.

When the ratio of the first magnetic domain MD1 and the second magnetic domain MD2 in the magnetic recording layer 10 changes, the resistance value of the magnetic domain wall movement element 100 changes. The resistance value of the magnetic domain wall movement element 100 changes depending on a relative angle of a magnetization of the ferromagnetic layer sandwiching the non-magnetic layer 20. In the case of the magnetic domain wall movement element 100 shown in FIG. 3, it changes depending on the relative angle between the magnetizations $M_{1A}$ and Mm of the first ferromagnetic layer 1 and the magnetization $M_{31}$ of the ferromagnetic layer 31. When the ratio of the first magnetic domain MD1 increases, the resistance value of the magnetic domain wall movement element 100 decreases, and when the ratio of the second magnetic domain MD2 increases, the resistance value of the magnetic domain wall movement element 100 increases.

The magnetic recording layer 10 has a first ferromagnetic layer 1, a spacer layer 3, and a second ferromagnetic layer 2 in order from the non-magnetic layer 20 side. The spacer layer 3 is sandwiched between the first ferromagnetic layer 1 and the second ferromagnetic layer 2. The magnetizations $M_{1A}$ and $M_{1B}$ of the first ferromagnetic layer 1 are antiferromagnetically coupled to each of the magnetizations $M_{2A}$ and $M_{2B}$ of the second ferromagnetic layer via the spacer layer 3.

The electrical resistivity of the first ferromagnetic layer 1 is higher than the electrical resistivity of the second ferromagnetic layer 2. The magnetic domain wall DW in the second ferromagnetic layer 2 having a low electrical resistivity is easier to move than the magnetic domain wall DW in the first ferromagnetic layer 1. When the writing current is applied, the magnetic domain wall DW in the second ferromagnetic layer 2 operates before the magnetic domain wall DW in the first ferromagnetic layer 1. As a result, the positions of the magnetic domain wall DW in the x direction shift between the first ferromagnetic layer 1 and the second ferromagnetic layer 2. When the positions of the magnetic domain wall DW in the x direction shift, an RKKY torque acts on the magnetization. The RKKY torque assists with the reversal of magnetization, and the operation of the magnetic domain wall DW becomes efficient.

The first ferromagnetic layer 1 has, for example, a value obtained by dividing the electrical resistivity by an area of the y-z plane greater than that of the second ferromagnetic layer 2. Further, the first ferromagnetic layer 1 has a higher electrical resistance than, for example, the second ferromagnetic layer 2. The first ferromagnetic layer 1 is close to the magnetization reference layer 30 with the non-magnetic layer 20 interposed therebetween. When the first ferromagnetic layer 1 generates heat, the stability of the magnetizations $M_{31}$ and $M_{33}$ of the magnetization reference layer 30 decreases. When the electrical resistance of the first ferromagnetic layer 1 is higher than that of the second ferromagnetic layer 2, it is possible to suppress a large current from flowing through the first ferromagnetic layer 1. The smaller the amount of current flowing through the first ferromagnetic layer 1 is, the more the generation of Joule heat in the first ferromagnetic layer 1 is suppressed.

The first ferromagnetic layer 1 and the second ferromagnetic layer 2 include a magnetic material. The first ferromagnetic layer 1 and the second ferromagnetic layer 2 are, for example, a laminated film in which different elements are laminated in a layer shape, a ferromagnetic metal, or an alloy.

The laminated film is, for example, a laminated film in which the ferromagnetic layer and the non-magnetic layer are alternately laminated. The laminated film may be a laminated film in which different ferromagnetic layers are alternately laminated. The ferromagnetic layer is, for example, a magnetic material such as Co, Fe or Ni, or an alloy including these magnetic materials. The non-magnetic layer is, for example, Pt, Pd, Gd, Tb, Mn, Ge, Ga, Cu, Sn, Au, Cr, Ag, or W. A thickness of each layer constituting the laminated film is about several layers of atoms. The laminated film is, for example, an alloy having a superlattice structure. The laminated film includes, for example, a laminated film ([Co/Pt]) of Co and Pt, a laminated film ([Co/Pd]) of Co and Pd, a laminated film ([Co/Ni]) of Co and Ni, a laminated film ([Co/Pt]) of Co and Tb, a laminated film ([CoFe/Pt]) of CoFe and Pt, or a laminated film ([CoFe/Ni]) of CoFe and Ni.

The ferromagnetic metal is, for example, a metal selected from the group consisting of Cr, Mn, Co, Fe and Ni. The alloy is, for example, an alloy containing one or more of the above-mentioned ferromagnetic metals. The alloy is, for example, an alloy containing the above-mentioned ferromagnetic metal and at least one or more elements of B, C, and N. The alloy is, for example, CoFe, CoFeB, NiFe, a MnGa-based material, a GdCo-based material, or a TbCo-based material.

The first ferromagnetic layer 1 and the second ferromagnetic layer 2 differ in, for example, the constituent elements or compositions.

For example, the first ferromagnetic layer 1 and the second ferromagnetic layer 2 are both laminated films, and at least one of their constituent elements is different. For example, the first ferromagnetic layer 1 is [Co/Pd] and the second ferromagnetic layer 2 is [Co/Ni]. The electrical resistivity of [Co/Pd] is higher than the electrical resistivity of [Co/Ni].

For example, the first ferromagnetic layer 1 is a ferromagnetic metal or alloy, and the second ferromagnetic layer 2 is a laminated film. For example, the first ferromagnetic layer 1 is CoFeB, and the second ferromagnetic layer 2 is [Co/Pd]. The electrical resistivity of CoFeB is higher than the electrical resistivity of [Co/Pd].

For example, both the first ferromagnetic layer 1 and the second ferromagnetic layer 2 are a ferromagnetic metal or alloy, and at least one of their constituent elements is different. For example, the first ferromagnetic layer 1 is CoFeB, and the second ferromagnetic layer 2 is Co. The electrical resistivity of CoFeB is higher than the electrical resistivity of Co.

For example, the first ferromagnetic layer 1 is a laminated film, and the second ferromagnetic layer 2 is a ferromagnetic metal or alloy. For example, the first ferromagnetic layer 1 is [Co/Tb], and the second ferromagnetic layer 2 is Co. The electrical resistivity of [Co/Tb] is higher than the electrical resistivity of Co.

For example, both the first ferromagnetic layer 1 and the second ferromagnetic layer 2 are alloys having the same constituent elements, and the composition ratios of the constituent elements are different. For example, both the first ferromagnetic layer 1 and the second ferromagnetic layer 2 are CoFeB, and have different boron concentrations. When the concentration of boron in CoFeB increases, the electrical resistivity increases.

Further, the first ferromagnetic layer 1 and the second ferromagnetic layer 2 may have, for example, the same constituent elements or compositions, but may have different layer configurations. For example, both the first ferromagnetic layer 1 and the second ferromagnetic layer 2 may be laminated films made of the same constituent elements, and the thickness of each layer may be different. For example, both the first ferromagnetic layer 1 and the second ferromagnetic layer 2 are [Co/Pd], and the film thicknesses of the Co layer and the Pd layer are different. For example, in the first ferromagnetic layer 1, a thickness of the Co layer is 2 Å, and a thickness of the Pd layer is [Co (2 Å)/Pd (5 Å)] of 5 Å. In the second ferromagnetic layer 2, the thickness of the Co layer is 1.6 Å, and the thickness of the Pd layer is [Co (1.6 Å)/Pd (2.2 Å)] of 2.2 Å. The electrical resistivity of the ferromagnetic layer can also be adjusted by adjusting the film thickness of the element having a high electrical resistivity among the elements constituting the laminated film.

The first ferromagnetic layer 1 includes, for example, CoFeB. The first ferromagnetic layer 1 is, for example, CoFeB. The resistance value of the magnetic domain wall movement element 100 changes depending on the relative angle of a magnetization of the ferromagnetic layer sandwiching the non-magnetic layer 20. When CoFeB is used as the first ferromagnetic layer 1, the MR ratio of the magnetic domain wall movement element 100 increases, and the resistance change width is widened.

For example, the saturated magnetization of the first ferromagnetic layer 1 is different from the saturated magnetization of the second ferromagnetic layer 2. When the saturated magnetizations of the first ferromagnetic layer 1 and the second ferromagnetic layer 2 are different from each other, a difference between the saturated magnetization of the first ferromagnetic layer 1 and the saturated magnetization of the second ferromagnetic layer 2 is a saturated magnetization of the entire magnetic recording layer 10. When the entire magnetic recording layer 10 has saturated magnetization, the movement speed of the magnetic domain wall DW can be slowed down as compared to a case without the saturated magnetization (when the saturated magnetization of the first ferromagnetic layer 1 is the same as the saturated magnetization of the second ferromagnetic layer 2). When the movement speed of the magnetic domain wall DW is slowed down, one magnetic domain wall movement element 100 can express many gradations, and analog data recording is also enabled.

The spacer layer 3 is made of a non-magnetic material. The spacer layer 3 is, for example, Ru, Ir, or Rh. The thermal conductivity of the spacer layer 3 is lower than, for example, that of the second ferromagnetic layer 2. The thermal conductivity of the spacer layer 3 may be lower than, for example, that of the first ferromagnetic layer 1. When the thermal conductivity of the spacer layer 3 is low, it is possible to prevent the heat generated in the second ferromagnetic layer 2 from reaching the first ferromagnetic layer 1.

"Non-Magnetic Layer"

The non-magnetic layer 20 is located between the magnetic recording layer 10 and the magnetization reference layer 30. The non-magnetic layer 20 is laminated on one surface of the magnetic recording layer 10.

The non-magnetic layer 20 is made of, for example, a non-magnetic insulator, a semiconductor or a metal. The non-magnetic insulator is, for example, $Al_2O_3$, $SiO_2$, MgO, $MgAl_2O_4$, and a material in which some of Al, Si, and Mg are replaced with Zn, Be, and the like. These materials have a large bandgap and excellent insulating properties. When the non-magnetic layer 20 is made of a non-magnetic insulator, the non-magnetic layer 20 is a tunnel barrier layer. The non-magnetic metals are, for example, Cu, Au, Ag and the like. The non-magnetic semiconductors are, for example, Si, Ge, $CuInSe_2$, $CuGaSe_2$, Cu (In, Ga) See and the like.

The thickness of the non-magnetic layer 20 is, for example, 20 Å or more, and may be 25 Å or more. When the thickness of the non-magnetic layer 20 is thick, a resistance area product (RA) of the magnetic domain wall movement element 100 increases. The resistance area product (RA) of the magnetic domain wall movement element 100 is preferably $1 \times 10^4$ $\Omega \mu m^2$ or more, and more preferably $5 \times 10^4$ $\Omega \mu m^2$ or more. The resistance area product (RA) of the magnetic domain wall movement element 100 is expressed as a product of the element resistance of one magnetic domain wall movement element 100 and the element cross-sectional area of the magnetic domain wall movement element 100 (the area of the cut surface obtained by cutting the non-magnetic layer 20 in the x-y plane).

"Magnetization Reference Layer"

The magnetization reference layer 30 is laminated on the non-magnetic layer 20. The magnetization reference layer 30 is made up of, for example, a ferromagnetic layer 31, an intermediate layer 32, and a ferromagnetic layer 33. The magnetization $M_{31}$ of the ferromagnetic layer 31 and the magnetization $M_{33}$ of the ferromagnetic layer 33 are antiferromagnetically coupled.

The ferromagnetic layer 31 includes a ferromagnetic material. The ferromagnetic layer 31 includes, for example, a material that easily obtains a coherent tunnel effect between the ferromagnetic layer 31 and the magnetic recording layer 10. The ferromagnetic layer 31 includes, for example, a metal selected from a group consisting of Cr, Mn, Co, Fe and Ni, an alloy including at least one kind or more of the metals, and an alloy including these metals and at least one kind or more elements of B, C, and N, and the like. The ferromagnetic layer 31 is, for example, Co—Fe, Co—Fe—B, and Ni—Fe.

The ferromagnetic layer 31 may be, for example, a Heusler alloy. The Heusler alloy is a half metal, and has a high spin polarizability. The Heusler alloy is an intermetallic compound having a chemical composition of XYZ or $X_2YZ$, X is a transition metal element or a noble metal element of group Co, Fe, Ni, or Cu on the periodic table, Y is a transition metal of group Mn, V, Cr or Ti or an elemental specie of X, and Z is a typical element of group III to group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ and the like.

The intermediate layer 32 is a non-magnetic layer. The intermediate layer 32 is, for example, Ru, Ir, and Rh.

The ferromagnetic layer 33 is antiferromagnetically coupled with the ferromagnetic layer 31. The ferromagnetic layer 33 is, for example, IrMn, PtMn, or the like.

The product of the film thickness of the ferromagnetic layer 31 and the saturated magnetization is substantially the same as the product of the film thickness of the ferromagnetic layer 33 and the saturated magnetization. The film thickness of the ferromagnetic layer 31 is, for example, the same as the film thickness of the ferromagnetic layer 33. The magnetization reference layer 30 has a synthetic antiferromagnetic structure.

The ferromagnetic layer 31 has a magnetization $M_{31}$ oriented in one direction. The magnetization $M_{31}$ of the ferromagnetic layer 31 is less likely to be reversely magnetized than the magnetizations $M_{1A}$ and $M_{1B}$ of the first ferromagnetic layer 1 when a predetermined external force is applied. The predetermined external force is, for example, an external force applied to the magnetization by an external magnetic field or an external force applied to the magnetization by a spin polarization current.

A direction of the magnetization of each layer of the magnetic domain wall movement element 100 can be checked, for example, by measuring the magnetization curve. The magnetization curve can be measured using, for example, MOKE (Magneto Optical Kerr Effect). The measurement by MOKE is a measuring method that is performed by making linearly polarized light incident on an object to be measured and using a magneto-optical effect (magnetic Kerr effect) in which rotation in a polarized light direction occurs.

"First Conductive Layer and Second Conductive Layer"

The first conductive layer 40 and the second conductive layer 50 are connected to the magnetic recording layer 10. The first conductive layer 40 and the second conductive layer 50 may be connected to the same surface of the magnetic recording layer 10 or may be connected to different surfaces. The second conductive layer 50 is separated from the first conductive layer 40 and connected to the magnetic recording layer 10. In a plan view from the z-direction, the first conductive layer 40 and the second conductive layer 50 sandwich the geometric center of the magnetic recording layer 10 in the x-direction. The first conductive layer 40 is connected to, for example, a first end portion of the magnetic recording layer 10, and the second conductive layer 50 is connected to, for example, a second end portion of the magnetic recording layer 10. The first conductive layer 40 and the second conductive layer 50 are, for example, electrodes that connect the connection wiring Cw and the magnetic recording layer 10. The first conductive layer 40 and the second conductive layer 50 include a conductor and may include a ferromagnetic material.

Next, a method of manufacturing the magnetic recording array 200 will be described. The magnetic recording array 200 is formed by a laminating process of each layer, and a processing process of processing a part of each layer into a predetermined shape. The lamination of each layer can use a sputtering method, a chemical vapor deposition (CVD) method, an electron beam vapor deposition method (EB vapor deposition method), an atomic laser deposit method, or the like. The processing of each layer can be performed by using photolithography or the like.

First, impurities are doped at a predetermined position on the substrate Sub to form a source region S and a drain region D. Next, a gate insulating film GI and a gate electrode G are formed between the source region S and the drain region D. The source region S, the drain region D, the gate insulating film GI, and the gate electrode G serve as a transistor Tr.

Next, an insulating layer In is formed to cover the transistor Tr. Further, a connection wiring Cw is formed by forming an opening portion in the insulating layer In and by filling a conductor inside the opening portion. The first wiring Wp and the second wiring Cm are formed by laminating the insulating layer In to a predetermined thickness, forming a groove in the insulating layer In, and filling the groove with a conductor.

The first conductive layer 40 and the second conductive layer 50 can be formed, for example, by laminating the conductive layer on one surface of the insulating layer In and the connection wiring Cw, and removing the portion other than the portions that become the first conductive layer 40 and the second conductive layer 50. The removed portion is filled with, for example, the insulating layer In.

Next, the magnetic recording layer 10, the non-magnetic layer 20, and the magnetization reference layer 30 are laminated in order on the first conductive layer 40, the second conductive layer 50, and the insulating layer In. After that, the non-magnetic layer 20 and the magnetization reference layer 30 are processed into a predetermined shape to obtain the magnetic domain wall movement element 100.

In the magnetic domain wall movement element 100 according to the first embodiment, since the electrical resistivity is different between the first ferromagnetic layer 1 and the second ferromagnetic layer 2, the positions of the magnetic domain wall DW in the x-direction shift at the time of the writing operation. The shift of the positions of the magnetic domain wall DW in the x-direction produces RKKY torque. The RKKY torque assists in the reversal of magnetization. As a result, the magnetic domain wall movement element 100 has high movement efficiency of the magnetic domain wall DW.

Also, if the movement efficiency of the magnetic domain wall DW is high, the current density required for writing can be reduced. The writing current is one of the occurrence causes of Joule heat, and can suppress the heat generation of the magnetic recording layer 10. Heat produces fluctuations in magnetization. When the heat generation of the magnetic recording layer 10 is suppressed, the reliability of the data of the magnetic domain wall movement element 100 is improved.

Although an example of the magnetic recording array 200 and the magnetic domain wall movement element 100 according to the first embodiment is described in detail, various changes and modifications can be made to the magnetic recording array 200 and the magnetic domain wall movement element 100 according to the first embodiment within the scope of the gist of the present disclosure.

First Modified Example

Figure 6:
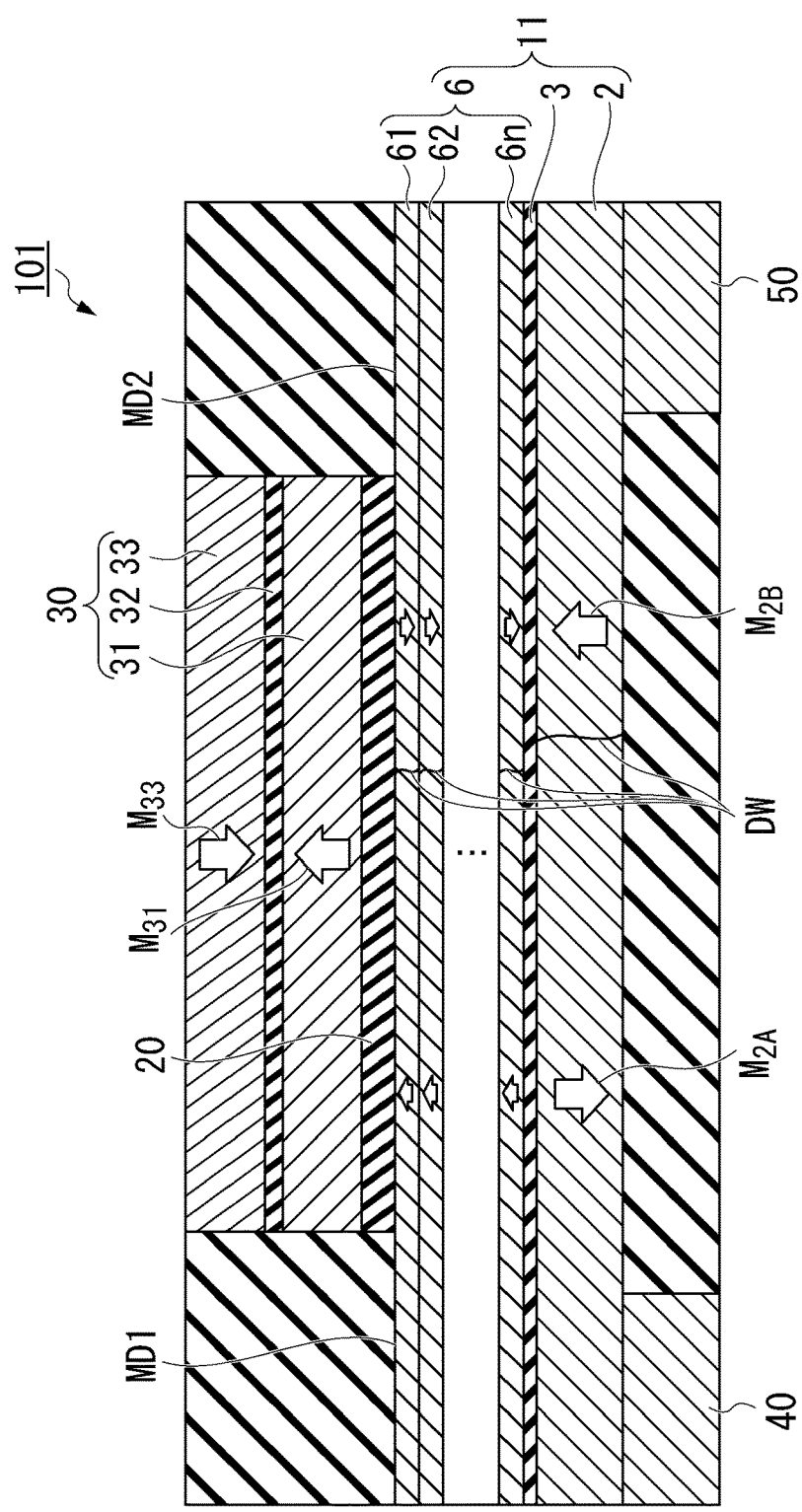
FIG. 6 is a cross-sectional view of a magnetic domain wall movement element according to a first modified example.

FIG. 6 is a cross-sectional view in which a magnetic domain wall movement element 101 according to the first modified example is cut in the x-z plane passing through the center of the magnetic recording layer 11 in the y-direction. The magnetic domain wall movement element 101 is different from the magnetic domain wall movement element 100 in that the first ferromagnetic layer 6 is made up of a plurality of ferromagnetic layers 61 to 6n (n is a constant). In FIG. 6, the description of the same configuration as in FIG. 3 will be omitted.

The magnetic recording layer 11 has a first ferromagnetic layer 6, a spacer layer 3, and a second ferromagnetic layer 2. The first ferromagnetic layer 6 is made up of a plurality of ferromagnetic layers 61 to 6n. The ferromagnetic layer closest to the non-magnetic layer 20 among the plurality of ferromagnetic layers 61 to 6n, is referred to as a first layer 61. The layers other than the first layer 61 among the plurality of ferromagnetic layers 61 to 6n are referred to as other layers 62 to 6n.

The electrical resistivity of the first layer 61 is higher than, for example, the electrical resistivity of the other layers 62 to 6n. Further, in the first layer 61, for example, a value obtained by dividing the electrical resistivity by the area of the y-z plane is larger than that of the other layers 62 to 6n. Further, the first layer 61 has, for example, a higher electrical resistance than the other layers 62 to 6n. By relatively lowering the current density at a position close to the non-magnetic layer 20, it is possible to reduce the influence of Joule heat generated on the magnetic recording layer 11 imparted to the magnetization reference layer 30. Further, by relatively increasing the current density at a position close to the spacer layer 3, the magnetic domain wall DW can be reliably moved.

Each of the plurality of ferromagnetic layers 61 to 6n has, for example, a different element or composition. Each of the plurality of ferromagnetic layers 61 to 6n is, for example, the above-mentioned laminated film, ferromagnetic metal, or alloy.

For example, the first layer 61 is a ferromagnetic metal or an alloy, and the other layers 62 to 6n are laminated films. At this time, the second ferromagnetic layer 2 is, for example, the above-mentioned laminated film, ferromagnetic metal, or alloy. For example, the first layer 61 is CoFeB, and the other layers are [Co/Pd] or [Co/Ni]. The second ferromagnetic layer 2 is, for example, [Co/Pd].

The magnetic domain wall movement element 101 according to the first modified example has the same effect as that of the magnetic domain wall movement element 100 according to the first embodiment. Further, the magnetic domain wall movement element 101 can make the current density of the position of the magnetic recording layer 11 close to the non-magnetic layer 20 relatively low, and can reduce the influence of Joule heat generated in the magnetic recording layer 11 imparted to the magnetization reference layer 30. Further, although a case where the first ferromagnetic layer 6 is made up of a plurality of ferromagnetic layers is shown, the second ferromagnetic layer 2 may be made up of a plurality of ferromagnetic layers.

Second Modified Example

Figure 7:
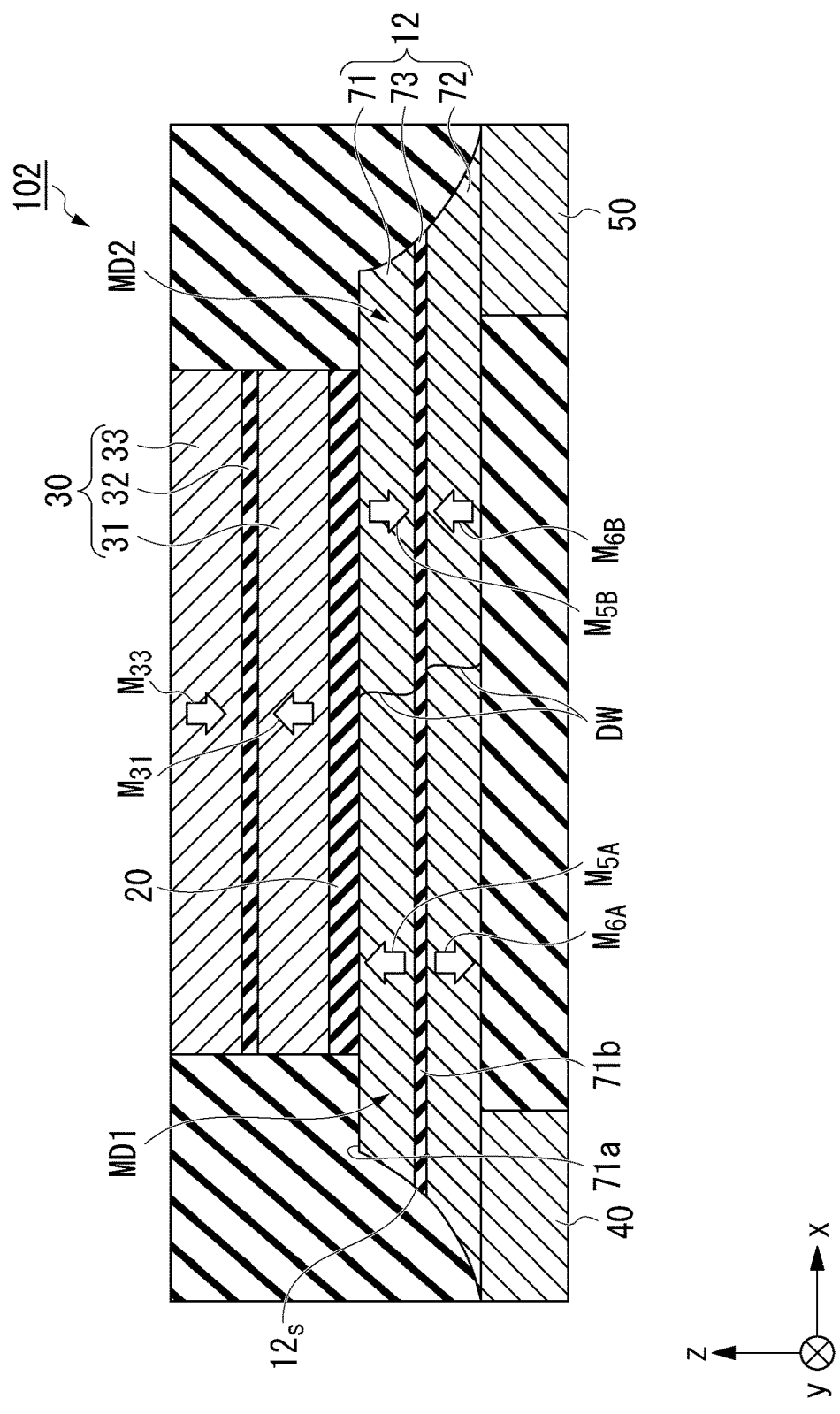
FIG. 7 is a cross-sectional view of a magnetic domain wall movement element according to a second modified example.
Figure 8:
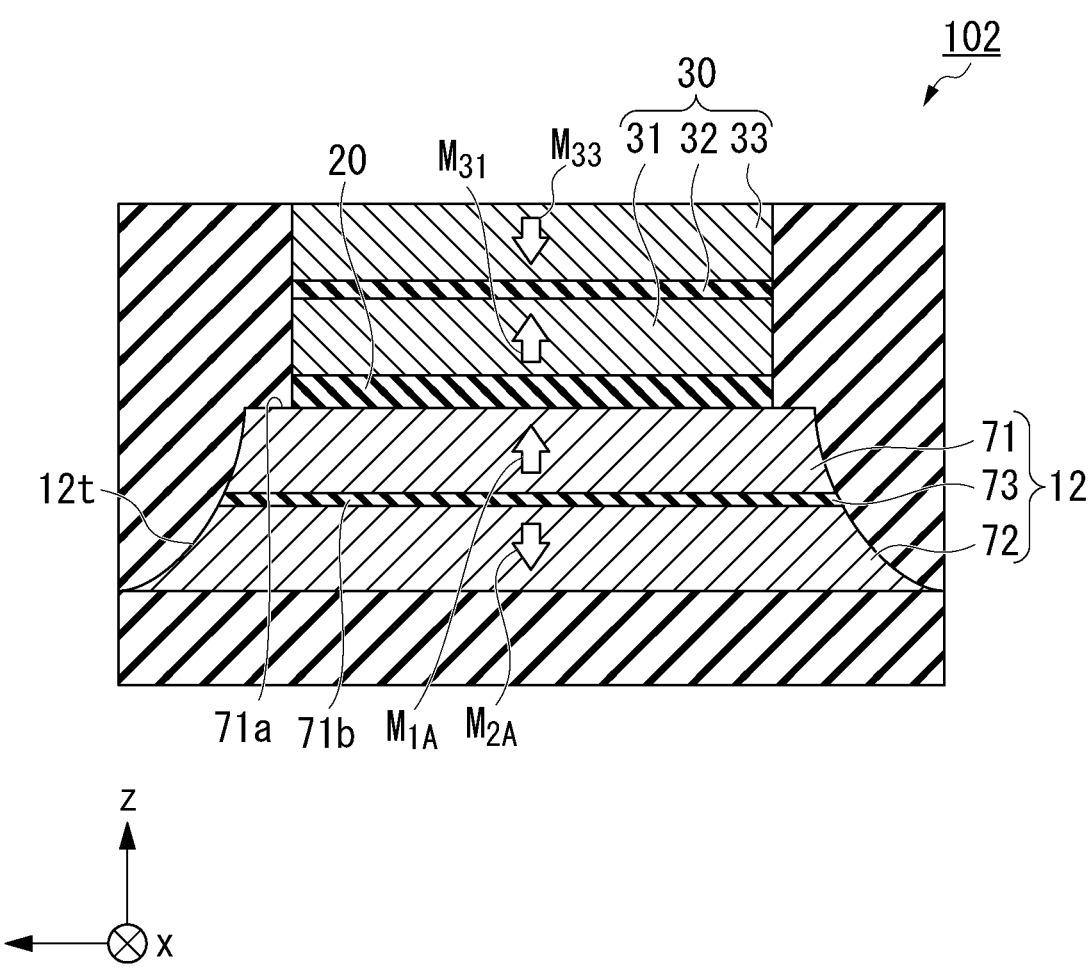
FIG. 8 is a cross-sectional view of a magnetic domain wall movement element according to the second modified example.

FIG. 7 is a cross-sectional view in which a magnetic domain wall movement element 102 according to the second modified example is cut in the x-z plane passing through the center of the magnetic recording layer 12 in the y-direction. FIG. 8 is a cross-sectional view in which the magnetic domain wall movement element 102 according to the second modified example is cut in the y-z plane passing through the center of the magnetic recording layer 12 in the x-direction. The magnetic domain wall movement element 102 is different from the magnetic domain wall movement element 100 in that the side walls 12s and 12t of the magnetic recording layer 12 are inclined with respect to the z-direction. In FIGS. 7 and 8, the description of the same configuration as in FIGS. 3 and 4 will be omitted.

The magnetic recording layer 12 has a first ferromagnetic layer 71, a spacer layer 73, and a second ferromagnetic layer 72. The first ferromagnetic layer 71, the spacer layer 73, and the second ferromagnetic layer 72 are similar to the first ferromagnetic layer 1, the spacer layer 3, and the second ferromagnetic layer 2, except that the side walls are inclined with respect to the z-direction. The magnetic recording layer 12 is inclined with respect to the z-direction in both the side wall 12s in the x-direction and the side wall 12t in the y-direction.

The side walls of the first ferromagnetic layer 71, the spacer layer 73, and the second ferromagnetic layer 72 are continuous and form a side wall 13s as a whole. Here, the fact that the side walls are continuous means that the inclination of the inclination angle of the side surfaces on the cut surface obtained by cutting the x-z plane or the y-z plane changes continuously.

The width of the first ferromagnetic layer 71 differs between a first surface 71a and a second surface 71b in the x-direction and the y-direction. The first surface 71a is a surface of the first ferromagnetic layer 71 that is in contact with the non-magnetic layer 20. The second surface 71b is a surface opposite to the first surface 71a. The widths of the first surface 71a in the x-direction and the y-direction are narrower than, for example, the widths of the second surface 71b in the x-direction and the y-direction.

The magnetic domain wall movement element 102 according to the second modified example has the same effect as the magnetic domain wall movement element 100 according to the first embodiment. If the width of the first surface 71a is narrower than the width of the second surface 71b, because the cross-sectional area of the first ferromagnetic layer 1 decreases, the resistance value increases, and the flow rate to the second ferromagnetic layer 2 increases. Further, if the width of the first surface 71a is narrower than the width of the second surface 71b, the thermal resistance can be distributed in the first ferromagnetic layer 1, the heat is less likely to be transferred to the non-magnetic layer 20 side having a narrow area, and a relatively large amount of heat flows to the spacer layer 73 side. As a result, it is possible to suppress the heat generated in the second ferromagnetic layer 2 from being transferred to the non-magnetic layer 20 side.

Third Modified Example

Figure 9:
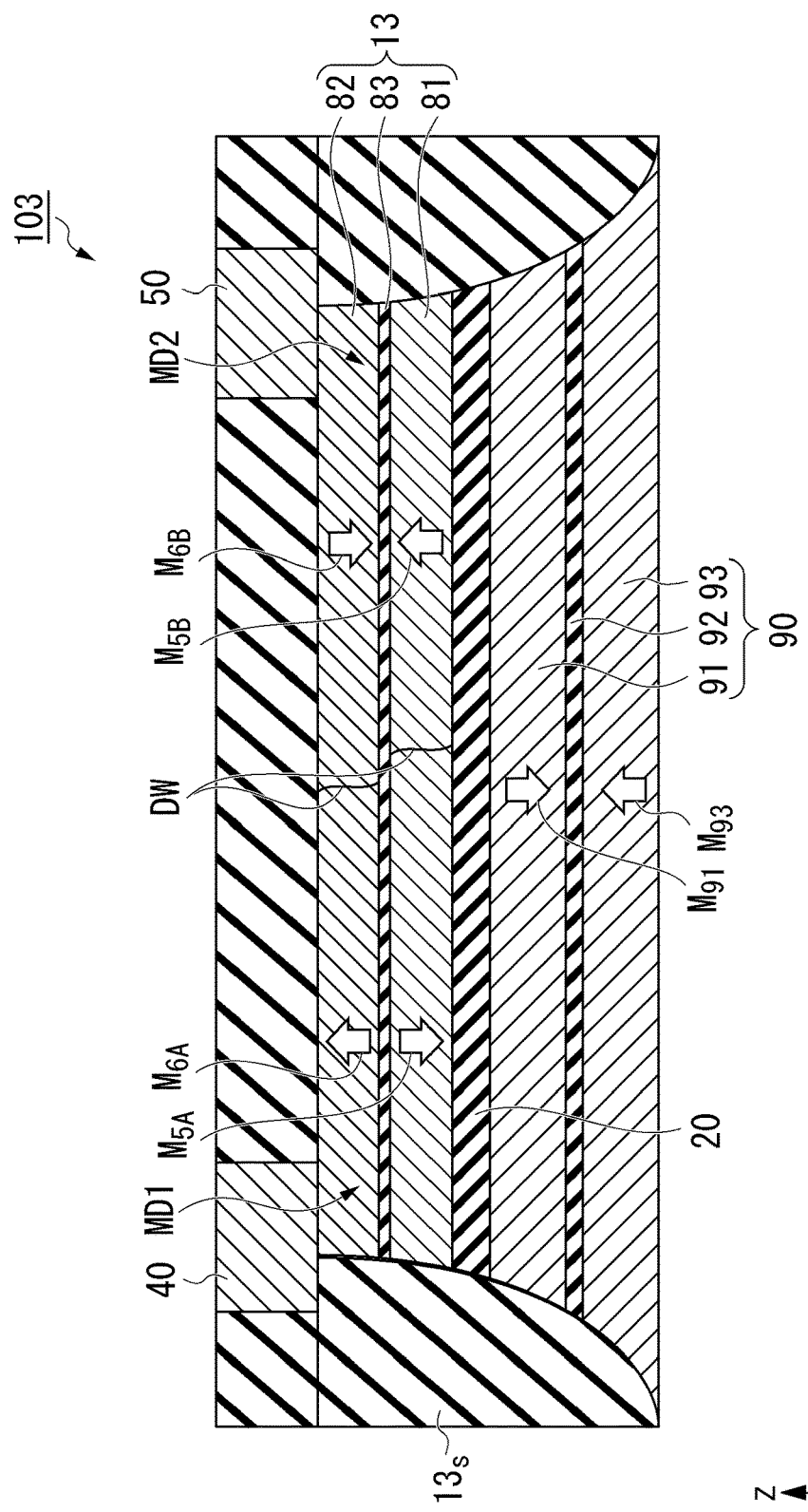
FIG. 9 is a cross-sectional view of a magnetic domain wall movement element according to a third modified example.

FIG. 9 is a cross-sectional view in which a magnetic domain wall movement element 103 according to the third modified example is cut in the x-z plane passing through the center of the magnetic recording layer 13 in the y-direction. The magnetic domain wall movement element 103 is different from the magnetic domain wall movement element 100 in that a magnetization reference layer 90 is closer to the substrate Sub than the magnetic recording layer 13. In FIG. 9, the description of the same configuration as in FIG. 3 will be omitted.

The magnetic domain wall movement element 103 has a so-called bottom pin structure in which the magnetization reference layer 90 is closer to the substrate Sub than the magnetic recording layer 13. The magnetic recording layer 13 has a first ferromagnetic layer 81, a spacer layer 83, and a second ferromagnetic layer 82. The first ferromagnetic layer 81, the spacer layer 83, and the second ferromagnetic layer 82 are similar to the first ferromagnetic layer 1, the spacer layer 3, and the second ferromagnetic layer 2, except that the side wall 13s is inclined with respect to the z-direction. The magnetization reference layer 90 includes a ferromagnetic layer 91, an intermediate layer 92, and a ferromagnetic layer 93. The ferromagnetic layer 91, the intermediate layer 92, and the ferromagnetic layer 93 are similar to the ferromagnetic layer 31, the intermediate layer 32, and the ferromagnetic layer 33, except that the side wall is inclined with respect to the z-direction.

The magnetic domain wall movement element 103 according to the third modified example has the same effect as the magnetic domain wall movement element 100 according to the first embodiment. That is, the configuration of the present disclosure can also be applied to the bottom pin structure. Further, the length of the first ferromagnetic layer 81 in the x-direction is longer than the length of the second ferromagnetic layer 82 in the x-direction. Therefore, for example, even when the electrical resistivities of the first ferromagnetic layer 81 and the second ferromagnetic layer 82 are the same, the resistance value of the first ferromagnetic layer 81 is greater than the resistance value of the second ferromagnetic layer 82. Therefore, in this case, even if the first ferromagnetic layer 81 and the second ferromagnetic layer 82 have the same electrical resistivity, the current density of a position of the magnetic recording layer 13 close to the non-magnetic layer 20 can be relatively low, and it is possible to reduce the influence of Joule heat generated in the magnetic recording layer 13 imparted to the magnetization reference layer 90.

REFERENCE SIGNS LIST 1, 6, 71, 81 First ferromagnetic layer
2, 72, 82 Second ferromagnetic layer
3, 73, 83 Spacer layer
10, 11, 12, 13 Magnetic recording layer
20 Non-magnetic layer
30, 90 Magnetization reference layer
61 First layer (ferromagnetic layer)
62 to 6n Other layers (ferromagnetic layer)
71a First surface
71b Second surface
100, 101, 102, 103 Magnetic domain wall movement element
200 Magnetic recording array
DW Magnetic domain wall

What is claimed is:
1. A magnetic domain wall movement element comprising:
   a magnetic recording layer which includes a ferromagnetic material;
   a non-magnetic layer which is laminated on the magnetic recording layer; and
   a magnetization reference layer which is laminated on the non-magnetic layer, wherein the magnetic recording layer has a first ferromagnetic layer, a spacer layer, and a second ferromagnetic layer in order from the non-magnetic layer,
a magnetization of the first ferromagnetic layer and a magnetization of the second ferromagnetic layer are antiferromagnetically coupled, and
an electrical resistivity of the first ferromagnetic layer is higher than an electrical resistivity of the second ferromagnetic layer.

2. The magnetic domain wall movement element according to claim 1, wherein a value obtained by dividing the electrical resistivity by an area of a cross section orthogonal to a first direction in which the magnetic recording layer extends is greater in the first ferromagnetic layer than in the second ferromagnetic layer.

3. The magnetic domain wall movement element according to claim 1, wherein the first ferromagnetic layer has a greater electrical resistance than the second ferromagnetic layer.

4. The magnetic domain wall movement element according to claim 1, wherein the first ferromagnetic layer and the second ferromagnetic layer have different constituent elements or compositions.

5. The magnetic domain wall movement element according to claim 1, wherein at least one of the first ferromagnetic layer and the second ferromagnetic layer has a plurality of ferromagnetic layers.

6. The magnetic domain wall movement element according to claim 1, wherein the first ferromagnetic layer has a plurality of ferromagnetic layers, and
an electrical resistivity of a first layer closest to the non-magnetic layer among the plurality of ferromagnetic layers is higher than an electrical resistivity of other layers of the plurality of ferromagnetic layers.

7. The magnetic domain wall movement element according to claim 6, wherein a value obtained by dividing the electrical resistivity by an area of a cross section orthogonal to a first direction in which the magnetic recording layer extends is greater in the first layer than in the other layers.

8. The magnetic domain wall movement element according to claim 6, wherein the first layer has a greater electrical resistance than the other layers.

9. The magnetic domain wall movement element according to claim 1, wherein the ferromagnetic layer which is in contact with the non-magnetic layer includes CoFeB.

10. The magnetic domain wall movement element according to claim 1, wherein, on a first surface of the first ferromagnetic layer which is in contact with the non-magnetic layer, a width in a second direction intersecting a first direction in which the magnetic recording layer extends in a plan view from a laminating direction is narrower than a width of a second surface opposite to the first surface.

11. The magnetic domain wall movement element according to claim 1, wherein a saturated magnetization of the first ferromagnetic layer is different from a saturated magnetization of the second ferromagnetic layer.

12. The magnetic domain wall movement element according to claim 1, wherein the spacer layer has a lower thermal conductivity than the second ferromagnetic layer.

13. A magnetic recording array having a plurality of magnetic domain wall movement elements according to claim 1.

* * * * *